(12) United States Patent
Soda

(10) Patent No.: US 9,490,289 B2
(45) Date of Patent: Nov. 8, 2016

(54) IMAGE SENSING DEVICE AND CAMERA

(71) Applicant: CANON KABUSHIKI KAISHA, Tokyo (JP)

(72) Inventor: Takehiko Soda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 313 days.

(21) Appl. No.: 14/046,491

(22) Filed: Oct. 4, 2013

(65) Prior Publication Data

US 2014/0111663 A1    Apr. 24, 2014

(30) Foreign Application Priority Data

Oct. 23, 2012  (JP) ................................. 2012-234067

(51) Int. Cl.
*H01L 27/146*    (2006.01)
*H04N 5/232*    (2006.01)

(52) U.S. Cl.
CPC ..... *H01L 27/14629* (2013.01); *H01L 27/1464* (2013.01); *H01L 27/14641* (2013.01); *H01L 27/14685* (2013.01); *H04N 5/232* (2013.01); *H01L 27/14621* (2013.01); *H01L 27/14627* (2013.01); *H01L 27/14643* (2013.01)

(58) Field of Classification Search
None
See application file for complete search history.

(56) References Cited

U.S. PATENT DOCUMENTS

| | | | |
|---|---|---|---|
| 7,960,197 B2 | 6/2011 | Akiyama | |
| 8,039,914 B2 | 10/2011 | Akiyama | |
| 8,405,180 B2 | 3/2013 | Akiyama | |
| 8,614,494 B2 | 12/2013 | Kurogi | |
| 2010/0203665 A1 | 8/2010 | Park | |
| 2011/0241145 A1 | 10/2011 | Lenchenkov | |
| 2012/0241895 A1 | 9/2012 | Kurogi | ......................... 257/437 |
| 2013/0140432 A1* | 6/2013 | Bikumandla | ..... H01L 27/14689 250/208.1 |
| 2014/0048852 A1 | 2/2014 | Kurogi | |

FOREIGN PATENT DOCUMENTS

| | | |
|---|---|---|
| JP | 2006-261372 A | 9/2006 |
| JP | 2008-147333 A | 6/2008 |
| JP | 2012-204562 A | 10/2012 |

OTHER PUBLICATIONS

Takehiko Soda, U.S. Appl. No. 14/064,453, filed Oct. 28, 2013.

\* cited by examiner

*Primary Examiner* — Twyler Haskins
*Assistant Examiner* — Angel L Garces-Rivera
(74) *Attorney, Agent, or Firm* — Fitzpatrick, Cella, Harper & Scinto

(57) ABSTRACT

An image sensing device includes a plurality of photoelectric conversion portions. The device further includes a semiconductor substrate having a first surface for receiving incident light and a second surface on an opposite side to the first surface, the photoelectric conversion portions being provided therein, a first non-metal region arranged on a second surface side and arranged at a position at least partially overlapping with the photoelectric conversion portions, a second non-metal region arranged to be in contact with a side surface of the first non-metal region, and a reflection layer arranged on an opposite side of the first non-metal region to the semiconductor substrate. A refractive index of the first non-metal region is higher than a refractive index of the second non-metal region.

19 Claims, 12 Drawing Sheets

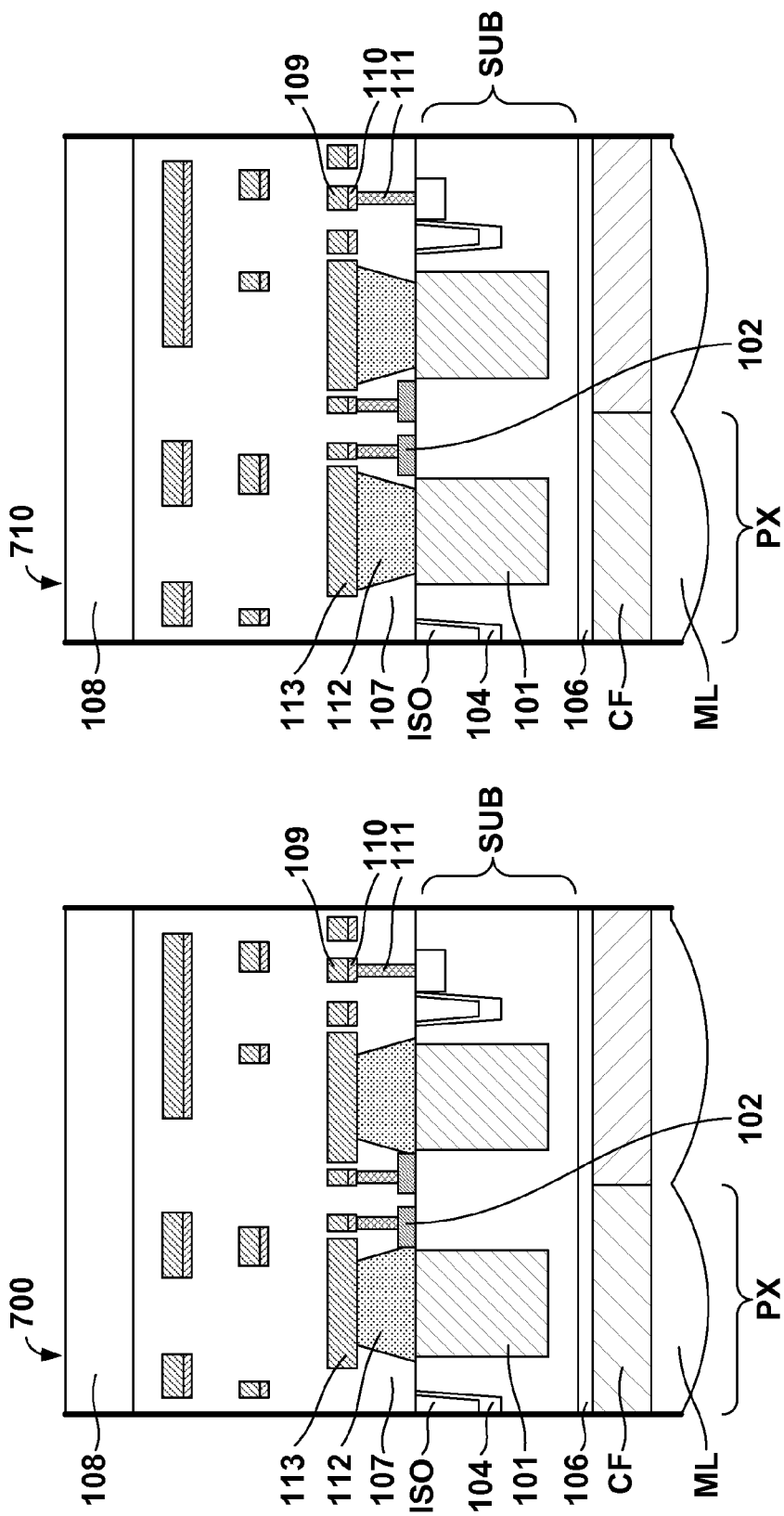

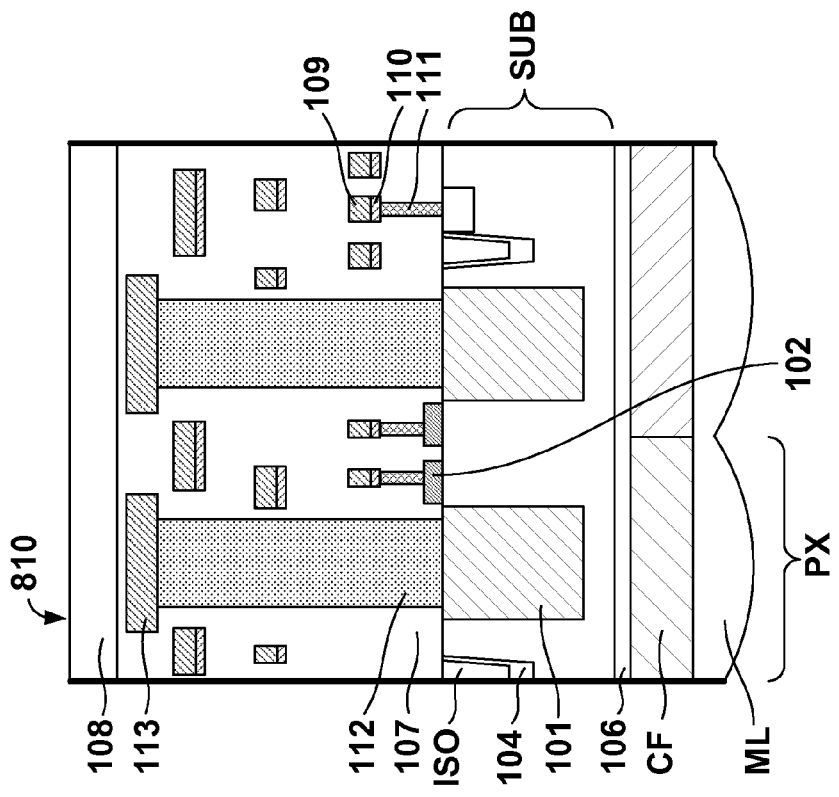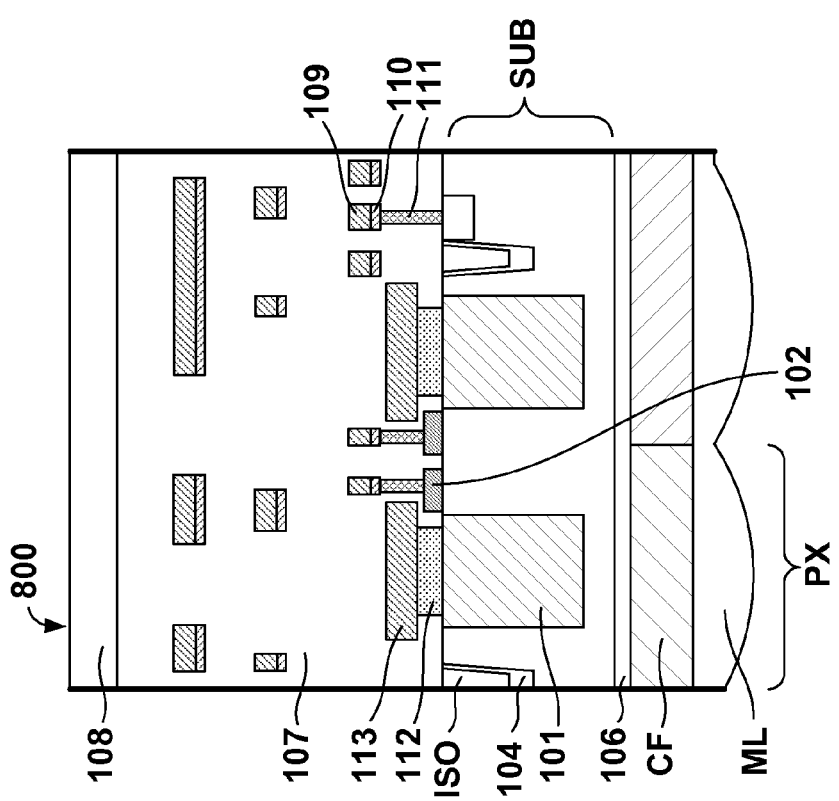

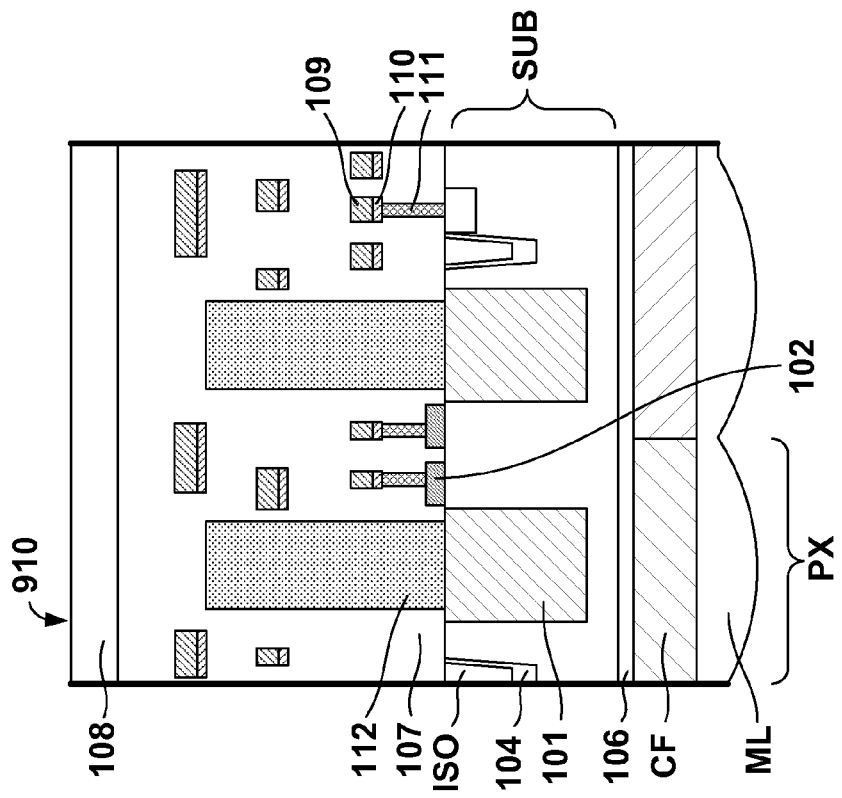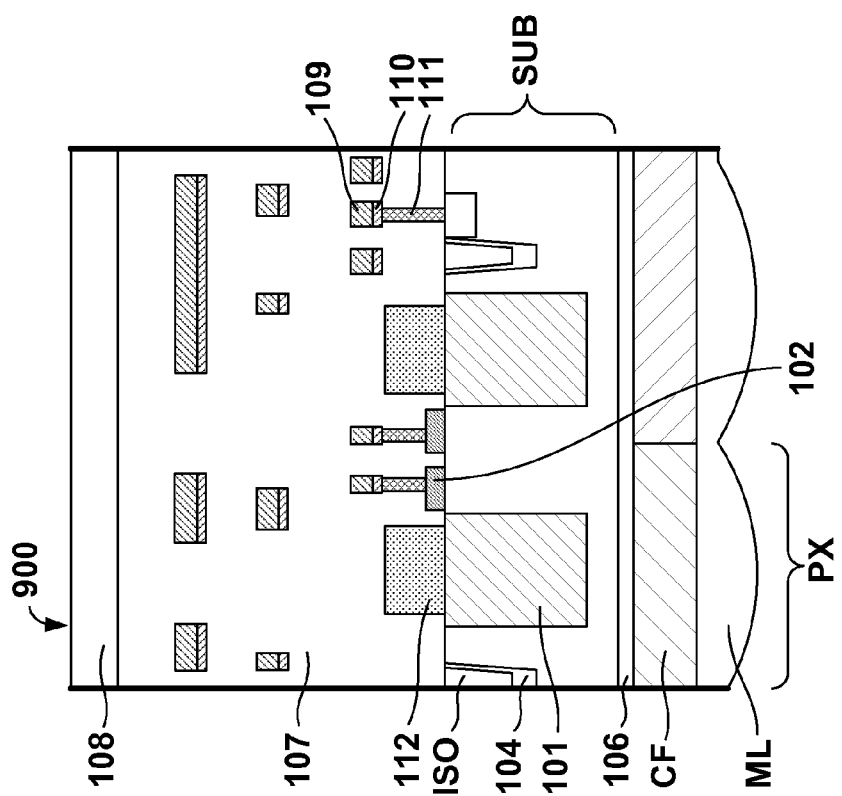

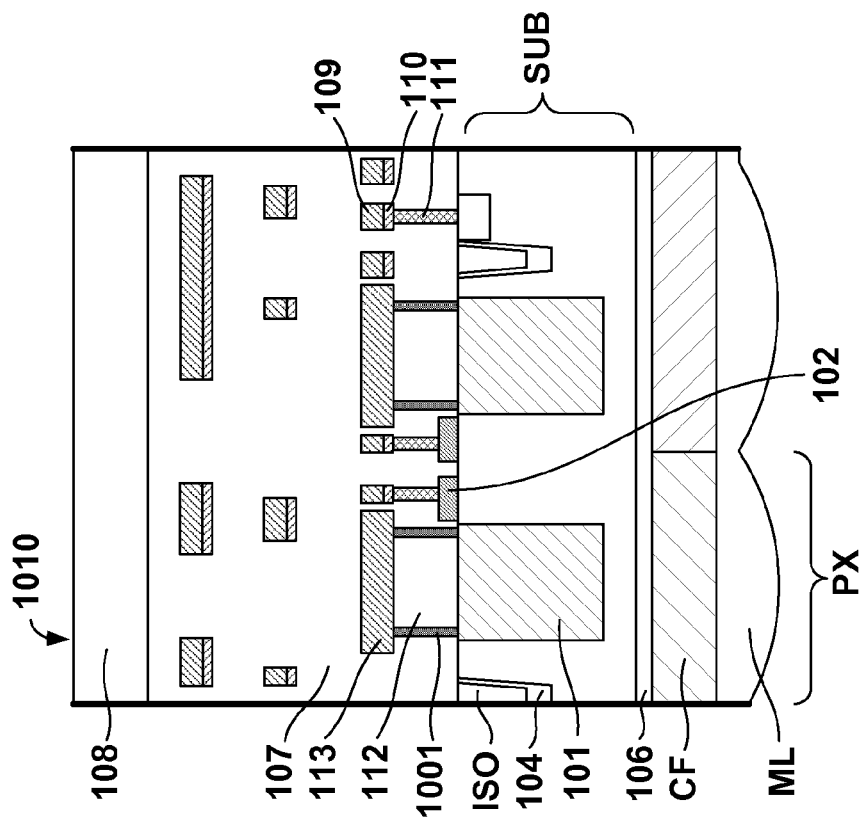
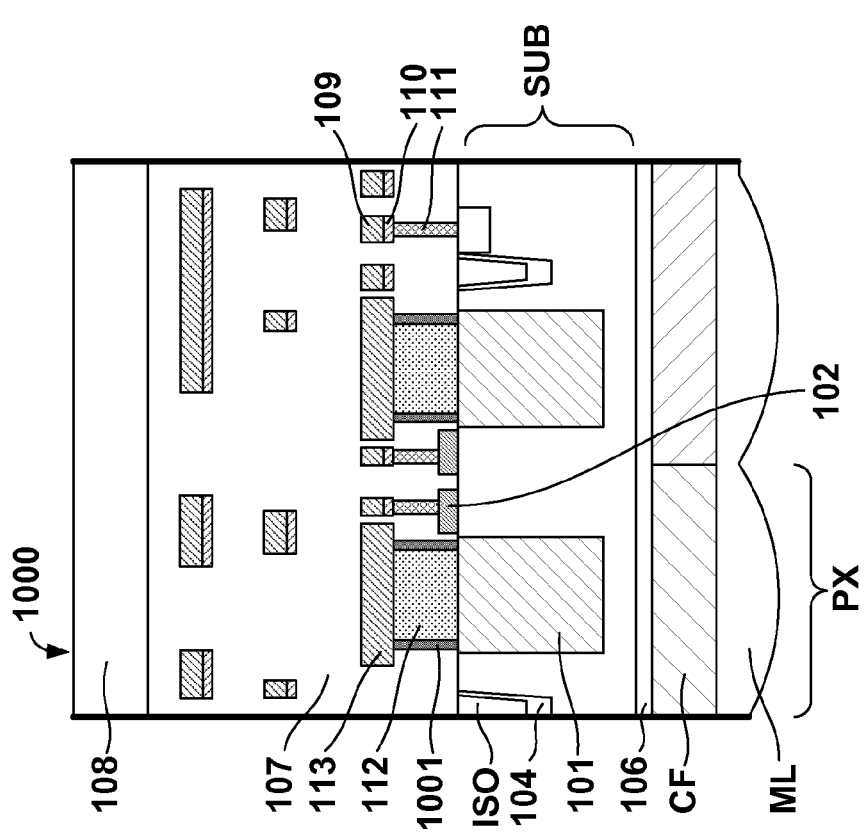

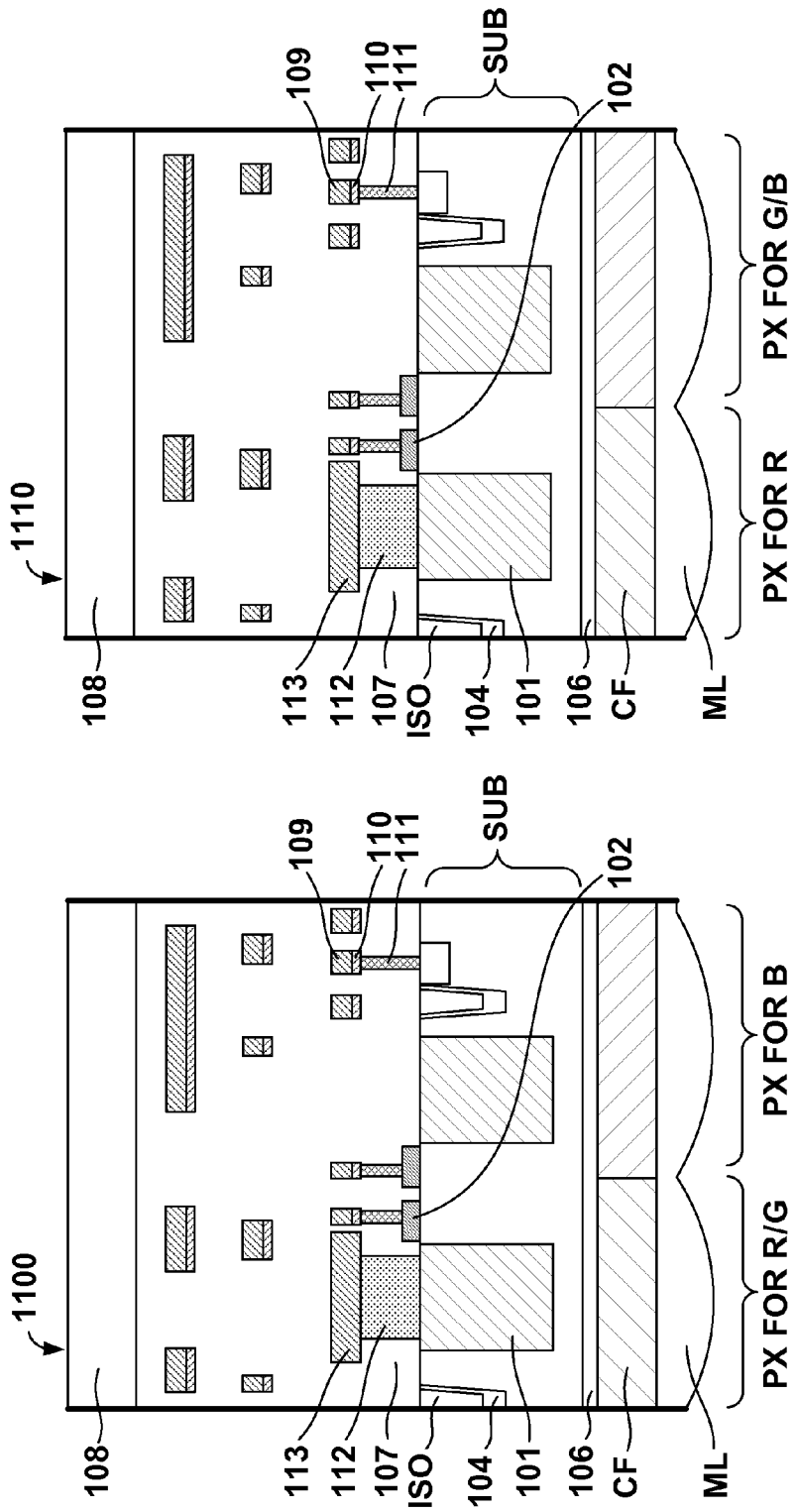

IMAGE SENSING DEVICE AND CAMERA

BACKGROUND OF THE INVENTION

Field of the Invention

The present invention relates to an image sensing device and a camera.

Description of the Related Art

In an image sensing device of back-side illumination, the thickness of a photoelectric conversion portion is generally thinner than that of a photoelectric conversion portion of an image sensing device of front-side illumination. Therefore, the photoelectric conversion portion does not sufficiently absorb incident light in the image sensing device of back-side illumination, and part of the incident light may penetrate through the photoelectric conversion portion. If the light penetrated through the photoelectric conversion portion is reflected by a wiring layer or the like and reaches a photoelectric conversion portion of another pixel, mixture of colors may occur between the pixels. To prevent the mixture of colors, Japanese Patent Laid-Open No. 2008-147333 proposes a structure of arranging a cylindrical metal layer over the photoelectric conversion portion through a gate insulating film. The light penetrated through the photoelectric conversion portion and entered inside of the cylindrical metal layer is reflected by the side of the metal layer.

SUMMARY OF THE INVENTION

According to some embodiments, an image sensing device is provided. The device includes a plurality of photoelectric conversion portions; a semiconductor substrate having a first surface for receiving incident light and a second surface on an opposite side to the first surface, the plurality of photoelectric conversion portions being provided therein; a first non-metal region arranged on a second surface side of the semiconductor substrate and arranged at a position at least partially overlapping with the plurality of photoelectric conversion portions; a second non-metal region arranged to be in contact with a side surface of the first non-metal region; and a reflection layer arranged on an opposite side of the first non-metal region to the semiconductor substrate. A refractive index of the first non-metal region is higher than a refractive index of the second non-metal region.

According to some other embodiments, the image sensing device includes a plurality of photoelectric conversion portions; a semiconductor substrate having a first surface for receiving incident light and a second surface on an opposite side to the first surface, the plurality of photoelectric conversion portions being provided therein; a first insulating layer arranged on a second surface side of the semiconductor substrate and arranged at a position at least partially overlapping with the plurality of photoelectric conversion portions; a second insulating layer arranged to be in contact with a side surface of the first insulating layer; and a reflection layer arranged on an opposite side of the first insulating layer to the semiconductor substrate. A refractive index of the first insulating layer is higher than a refractive index of the second insulating layer.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments, and together with the description, serve to explain the principles of the embodiments.

FIGS. 7A and 7B are diagrams for describing another modified example of the image sensing device.

FIGS. 8A and 8B are diagrams for describing another modified example of the image sensing device.

FIGS. 9A and 9B are diagrams for describing another modified example of the image sensing device.

FIGS. 10A and 10B are diagrams for describing another modified example of the image sensing device.

FIGS. 11A and 11B are diagrams for describing another modified example of the image sensing device.

DESCRIPTION OF THE EMBODIMENTS

Figure 1A:
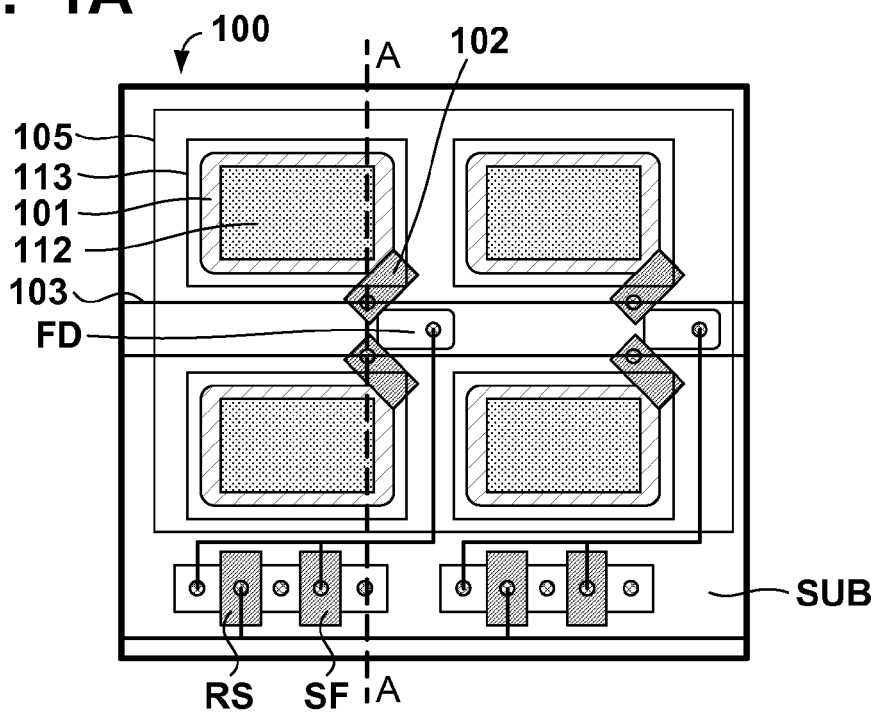
FIGS. 1A and 1B are diagrams for describing an example of a structure of an image sensing device.

In the structure of Japanese Patent Laid-Open No. 2008-147333, if light penetrating through the photoelectric conversion portion of a pixel and advancing in a direction closer to an adjacent pixel is reflected by the inner side of the cylindrical metal layer, the light advances in a direction away from the adjacent pixel. Therefore, the possibility of the occurrence of the mixture of colors is low. However, if light penetrating through the photoelectric conversion portion of a pixel and advancing in a direction closer to an adjacent pixel is reflected by the bottom surface of the cylindrical metal layer, the light continues to advance in the direction closer to the adjacent pixel. Therefore, after the light enters the semiconductor substrate again, the light may reach the photoelectric conversion portion of the adjacent pixel. In the image sensing device of front-side illumination, the light penetrating through the photoelectric conversion portion may also be reflected and reach another photoelectric conversion portion. Therefore, some embodiments provide a technique for reducing the mixture of colors in the image sensing device.

Some embodiments will be described below with reference to the attached drawings. Similar elements are designated with the same reference numerals throughout a plurality of embodiments, and the description will not be repeated. Each of the embodiments can be appropriately changed and combined.

Figure 1B:
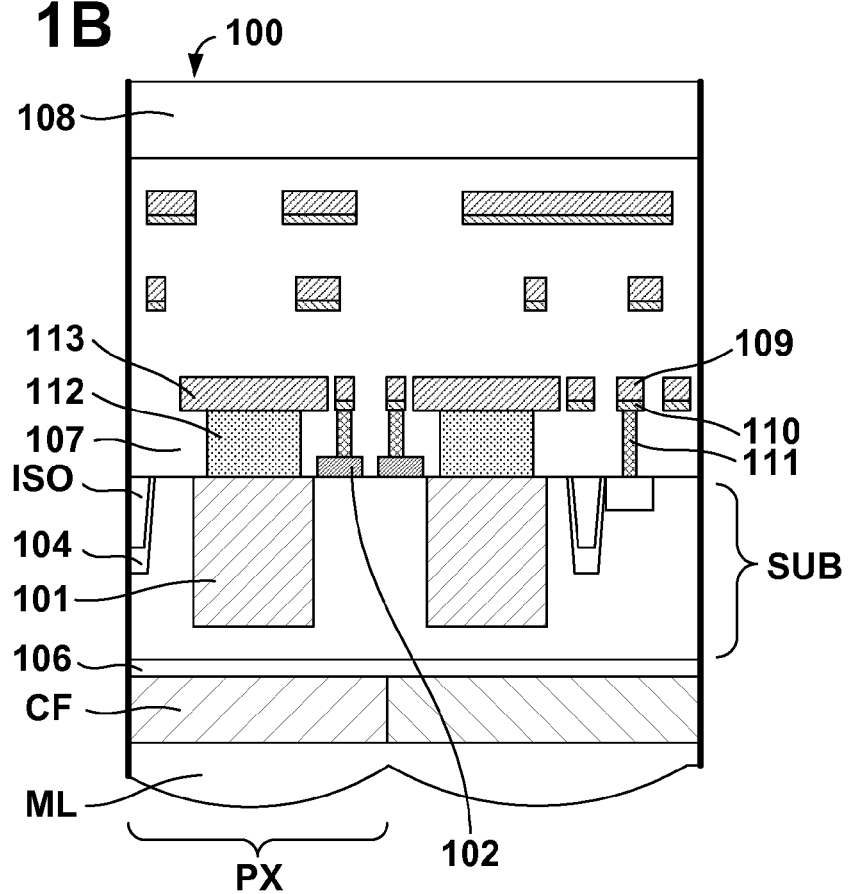

A structure of an image sensing device 100 according to some embodiments of the present invention will be described with reference to FIGS. 1A and 1B. FIG. 1A illustrates a plan view of part of the image sensing device 100, and FIG. 1B illustrates a cross-sectional view of an A-A line of FIG. 1A. In the plan view of FIG. 1A, some constituent elements are not illustrated in order to clarify the description. As illustrated in FIG. 1B, the image sensing device 100 is an image sensing device 100 of back-side illumination, and the image sensing device 100 can receive incident light from the lower side of the drawings to convert the light to a signal. The present invention is not limited to the configuration of the image sensing device illustrated in FIGS. 1A and 1B, and any configuration of an image sensing device can be applied.

The image sensing device 100 includes a plurality of pixels arranged in an array, and FIG. 1A illustrates four pixels PX of the plurality of pixels. Each of the pixels PX includes an n-type semiconductor region 101 formed in a p-type semiconductor substrate SUB, and the semiconductor region 101 can function as a photoelectric conversion portion. For example, the semiconductor region 101 can form a photodiode, in conjunction with a semiconductor region of reverse conductivity type arranged adjacently. The semiconductor region of reverse conductivity type arranged adjacently is not limited to the semiconductor substrate SUB, as long as the region is a p-type semiconductor region.

The semiconductor substrate SUB further includes a floating diffusion FD that is an n-type semiconductor region, and the floating diffusion FD is shared by two pixels PX vertically adjacent to each other in FIG. 1A. The pixel PX can include a transfer gate 102 at a position covering a region between the floating diffusion FD and the semiconductor region 101. The transfer gate 102 can be formed by polysilicon, for example. A gate line 103 is connected to the transfer gate 102, and a transfer transistor is controlled by a drive signal supplied to the gate line 103.

The floating diffusion FD is connected to a source follower transistor SF, and a signal according to the potential of the floating diffusion FD is supplied from the source follower transistor SF to a signal line. The floating diffusion FD is also connected to a reset transistor RS. When the reset transistor RS enters a conductive state, the potential of the floating diffusion FD is reset.

The semiconductor substrate SUB can include an element isolation region ISO, such as an STI (shallow trench isolation), and a p-type channel stop region 104 around the transistor or the photoelectric conversion portion. A solid line 105 of FIG. 1A illustrates a boundary between an active region and the element isolation region ISO. The image sensing device 100 can further include a planarizing layer 106, a color filter CF, and a microlens ML in this order near the side of the semiconductor substrate SUB where the light enters (lower side of FIG. 1B).

The image sensing device 100 can further include an interlayer insulating layer 107 and a support substrate 108 in this order on the opposite side of the side of the semiconductor substrate SUB where the light enters (upper side of FIG. 1B). The interlayer insulating layer 107 can be formed by silicon oxide, for example. The image sensing device 100 can include a plurality of wiring layers in the interlayer insulating layer 107. The wiring layer can include a wiring pattern 109 formed by aluminum, copper, or the like and a barrier metal 110 formed by TiN/Ti or the like. A circuit element formed in the semiconductor substrate SUB is connected to the wiring layer through a contact plug 111 formed by tungsten or the like.

The image sensing device 100 can further include a high refractive index region 112 (first non-metal region) in the interlayer insulating layer 107. In each pixel, the high refractive index region 112 is individually arranged over the semiconductor region 101 that functions as the photoelectric conversion portion. The high refractive index region 112 is arranged to at least partially overlap with the semiconductor region 101. More specifically, projections vertically projected on the surface of the photoelectric conversion portion of the semiconductor substrate at least partially overlap. The high refractive index region 112 may be an insulator (first insulating layer). The interlayer insulating layer 107 (second non-metal region) is in touch with the side of the high refractive index region 112. The high refractive index region 112 is formed by a non-metal material with a refractive index higher than that of the surrounding interlayer insulating layer 107. Examples of the material of the high refractive index region 112 include organic materials, such as a siloxane-based resin and polyimide, and inorganic materials, such as silicon nitride, silicon oxynitride, and titanium oxide. Examples of the material of the high refractive index region 112 can also include resins containing metal oxide, such as titanium oxide, tantalum oxide, niobium oxide, tungsten oxide, zirconium oxide, zinc oxide, indium oxide, and hafnium oxide. These metal oxides are all insulators (second insulating layers). Of the light incident on the image sensing device 100, light penetrated through the semiconductor region 101 and entered the bottom surface of the high refractive index region 112 (side closer to the semiconductor substrate SUB) is reflected by an interface between the high refractive index region 112 and the interlayer insulating layer 107 (side of the high refractive index region 112). More specifically, the high refractive index region 112 can function as a light guide. The interlayer insulating layer 107 that covers the side of the high refractive index region 112 is also a non-metal region. Therefore, the reflecting light toward adjacent pixels can be reduced, compared to when the side of the high refractive index region 112 is covered by metal.

The image sensing device 100 can further include a reflection layer 113 in the interlayer insulating layer 107. The reflection layer 113 is formed by metal, such as aluminum and copper. The reflection layer 113 reflects the light penetrated through the high refractive index region 112 and returns the light to the photoelectric conversion portion. In the present embodiment, the reflection layer 113 covers the entire upper surface of the high refractive index region 112 and covers the interlayer insulating layer 107 covering the side of the high refractive index region 112. As a result, the reflection layer 113 is formed in shape and position covering the boundary between the high refractive index region 112 and the interlayer insulating layer 107. In this way, the reflection layer 113 can efficiently reflect the light incident on the high refractive index region 112. The reflection layer 113 may form part of the wiring pattern 109. More specifically, a current may flow through the reflection layer 113, or a voltage may be applied to the reflection layer 113 in the operation of the image sensing device 100.

Figure 2A:
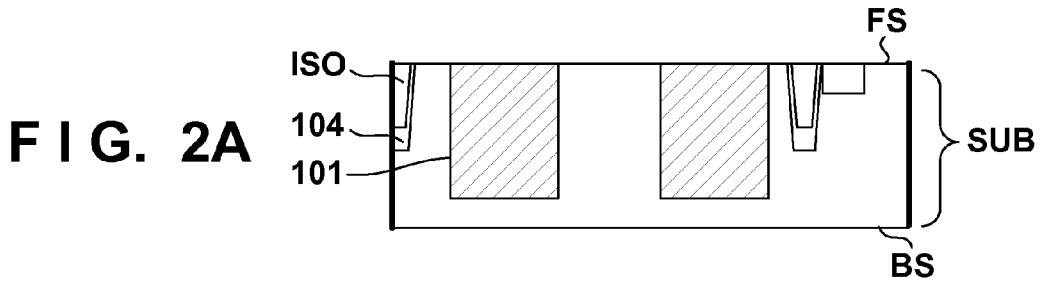
FIGS. 2A to 2E and 3A to 3D are diagrams for describing an example of a manufacturing method of the image sensing device.

An example of a manufacturing method of the image sensing device 100 of FIGS. 1A and 1B will be described with reference to FIGS. 2A to 2E and 3A to 3D. FIGS. 2A to 2E and 3A to 3D illustrate cross-sectional views at positions corresponding to FIG. 1B. First, the semiconductor substrate SUB with the structure described in FIGS. 1A and 1B is prepared as illustrated in FIG. 2A. The semiconductor substrate SUB can be formed by an existing method, and the formation will not be described. The semiconductor substrate SUB includes a front surface FS (first surface) and a back surface BS (second surface) on the opposite side of the front surface FS (opposite side of the first surface). The light incident on the image sensing device 100 enters the photoelectric conversion portion from the back surface BS of the semiconductor substrate SUB.

Figure 2B:
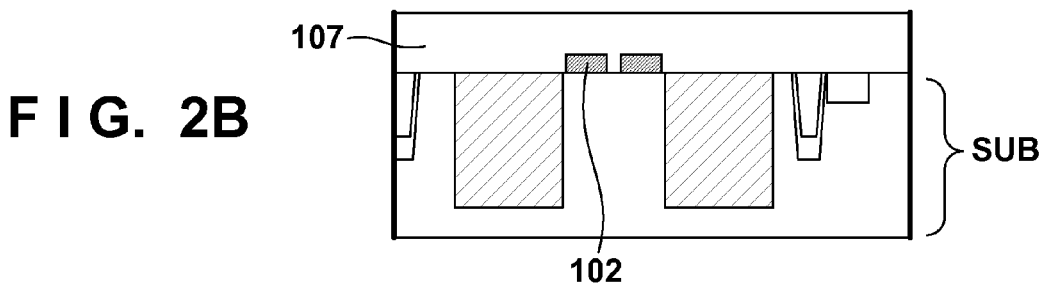

As illustrated in FIG. 2B, polysilicon or the like is used to form a transfer gate 102 or gates of other transistors. Although not illustrated, a gate insulating film is formed under the transfer gate 102. Subsequently, plasma CVD is used to accumulate silicon oxide on the front surface FS (the second surface) of the semiconductor substrate SUB from over the transfer gate 102, and the interlayer insulating layer 107 is deposited. The upper surface of the interlayer insulating layer 107 is planarized by CMP.

Figure 2C:
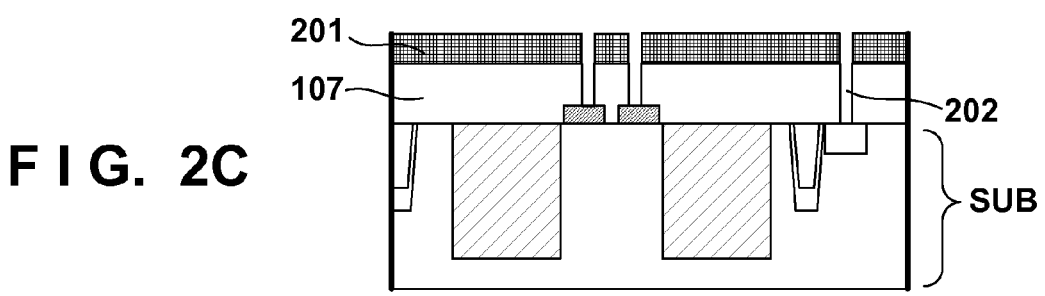

As illustrated in FIG. 2C, a resist pattern 201 is formed over the interlayer insulating layer 107. The resist pattern 201 exposes positions for forming contact plugs, such as the contact plug 111, connected to circuit elements formed on the semiconductor substrate SUB and coats the other parts. The resist pattern 201 is used as a mask to perform etching, and part of the interlayer insulating layer 107 is removed to form an opening 202. The opening 202 reaches the semiconductor substrate SUB, and the opening 202 exposes part of the front surface FS of the semiconductor substrate SUB.

Figure 2D:
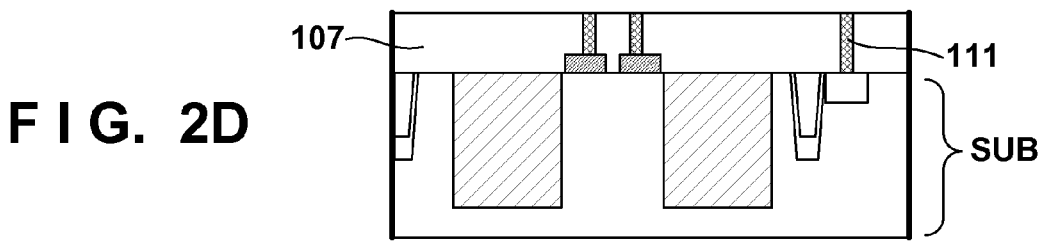
Figure 2E:
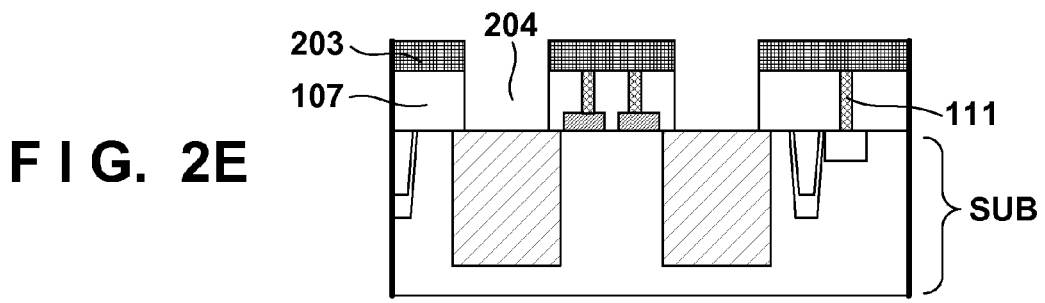

As illustrated in FIG. 2D, after the resist pattern 201 is removed, tungsten is embedded in the opening 202. As a result, the contact plug 111 is formed in the opening 202. As illustrated in FIG. 2E, a resist pattern 203 is formed over the interlayer insulating layer 107. The resist pattern 203 exposes positions for forming the high refractive index regions 112 of FIGS. 1A and 1B and coats the other parts. The resist pattern 203 is used as a mask to perform etching, and part of the interlayer insulating layer 107 is removed to form an opening 204. The opening 204 reaches the semiconductor substrate SUB, and the opening 204 exposes part of the front surface FS of the semiconductor substrate SUB.

Figure 3A:
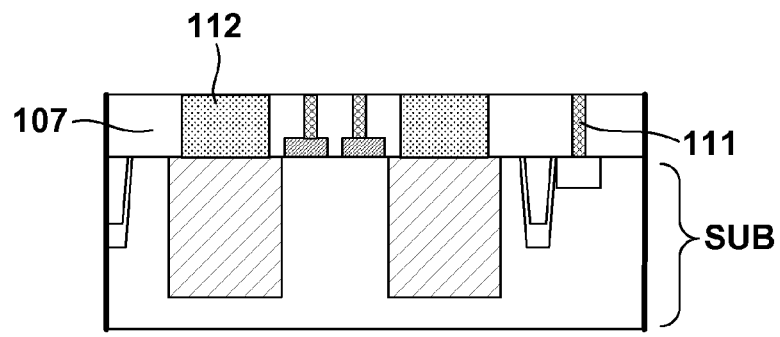

As illustrated in FIG. 3A, after the resist pattern 203 is removed, the high refractive index region 112 is formed in the opening 204 by the material described above. Although the high refractive index region 112 is formed to be in touch with the semiconductor substrate SUB in the embodiment of FIGS. 1A and 1B, an etching stop layer, a reflection prevention layer, and the like may be formed between the high refractive index region 112 and the semiconductor substrate SUB.

Figure 3B:
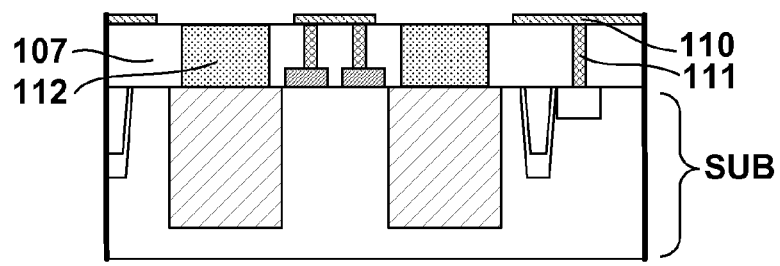
Figure 3C:
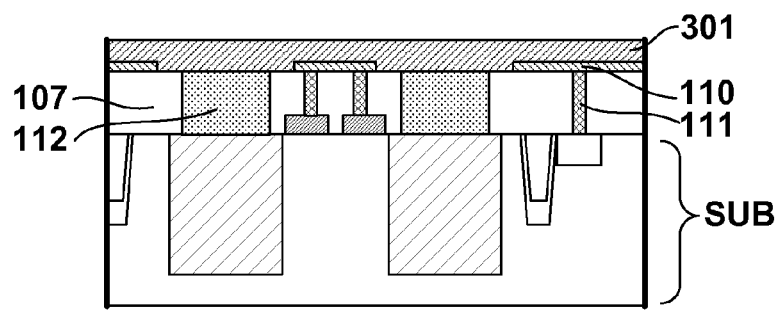
Figure 3D:
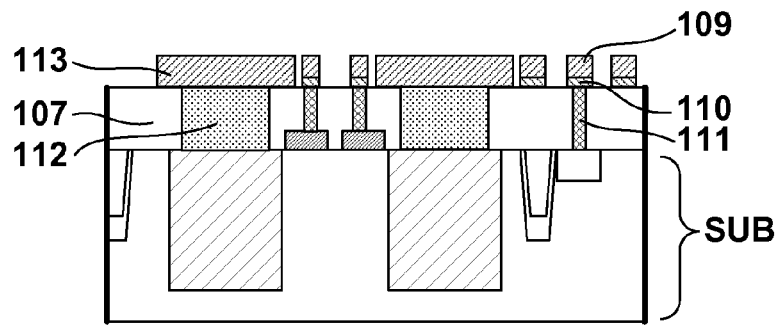

As illustrated in FIG. 3B, the barrier metal 110 is deposited over the interlayer insulating layer 107, the contact plug 111, and the high refractive index region 112, and the barrier metal 110 at positions for forming the reflection layer 113 are removed by etching. As illustrated in FIG. 3C, a metal layer 301, such as aluminum, is formed over the barrier metal 110 and over the regions where the barrier metal 110 is removed. As illustrated in FIG. 3D, the metal layer 301 and the barrier metal 110 are etched to pattern the wiring pattern 109 and the reflection layer 113 of the first layer. In this way, the patterning of the reflection layer 113 at the same time in the patterning process of the wiring pattern 109 can reduce the number of steps. Although the reflection layer 113 is formed in the patterning process for forming the wiring layer closest to the semiconductor substrate SUB in this example, the reflection layer 113 may be formed in a patterning process for forming another wiring layer. Subsequently, an existing method is used to form other constituent elements to complete the image sensing device 100 of FIGS. 1A and 1B.

Figure 4A:
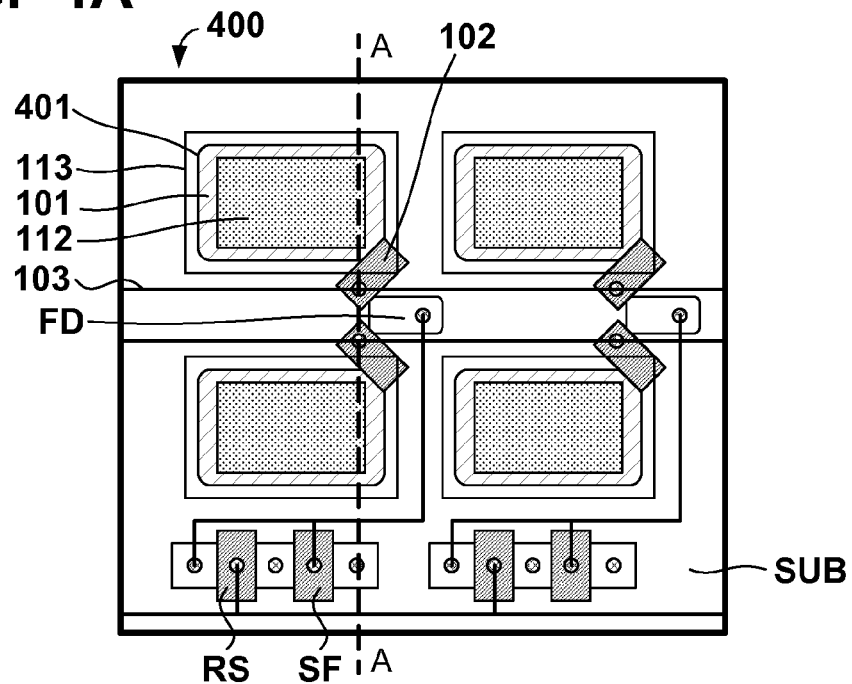
FIGS. 4A and 4B are diagrams for describing a modified example of the image sensing device.
Figure 4B:
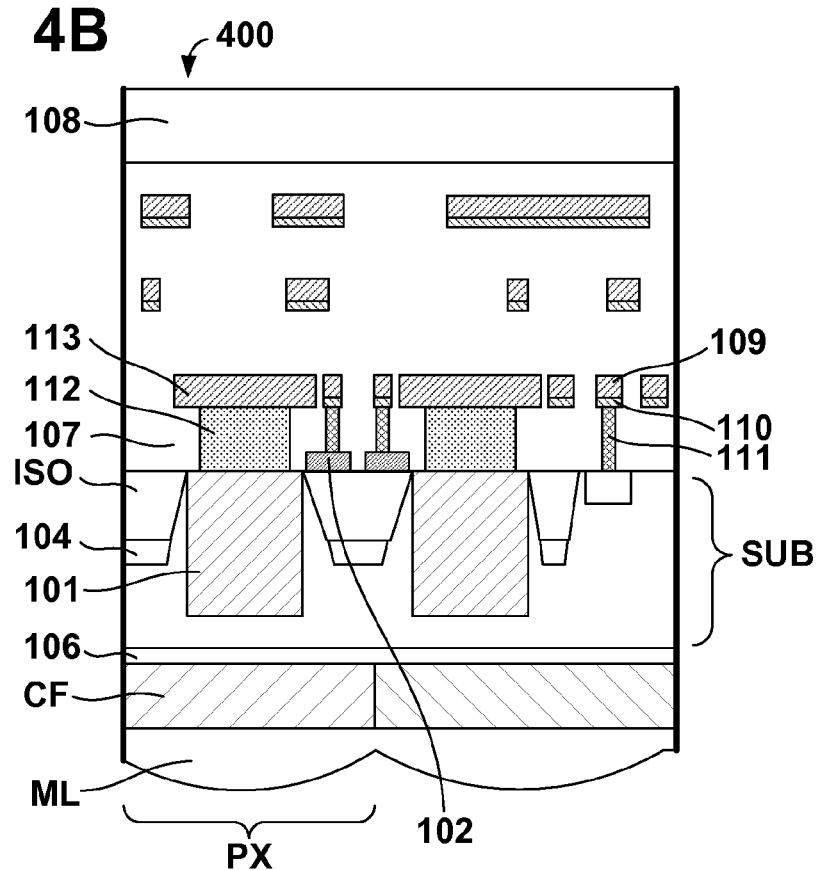

Modified examples of the image sensing device 100 according to the embodiment of FIGS. 1A and 1B will be described with reference to FIGS. 4A to 12. The modified examples described below can be combined with each other. The modified examples described below can also attain advantageous effects similar to those of the image sensing device 100. An image sensing device 400 of FIGS. 4A and 4B is different from the image sensing device 100 in that the semiconductor region 101 of each pixel PX is covered by an element isolation region ISO. A solid line 401 of FIG. 4A denotes a boundary between the active region and the element isolation region ISO. FIG. 4B is a schematic diagram of a cross section along a dotted line AA of FIG. 4A.

Figure 5A:
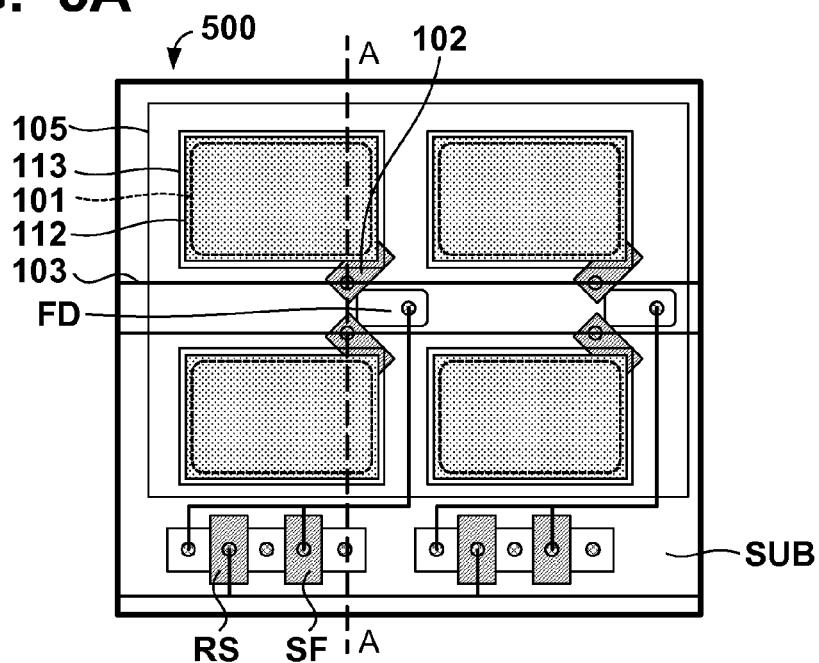
FIGS. 5A and 5B are diagrams for describing another modified example of the image sensing device.
Figure 5B:
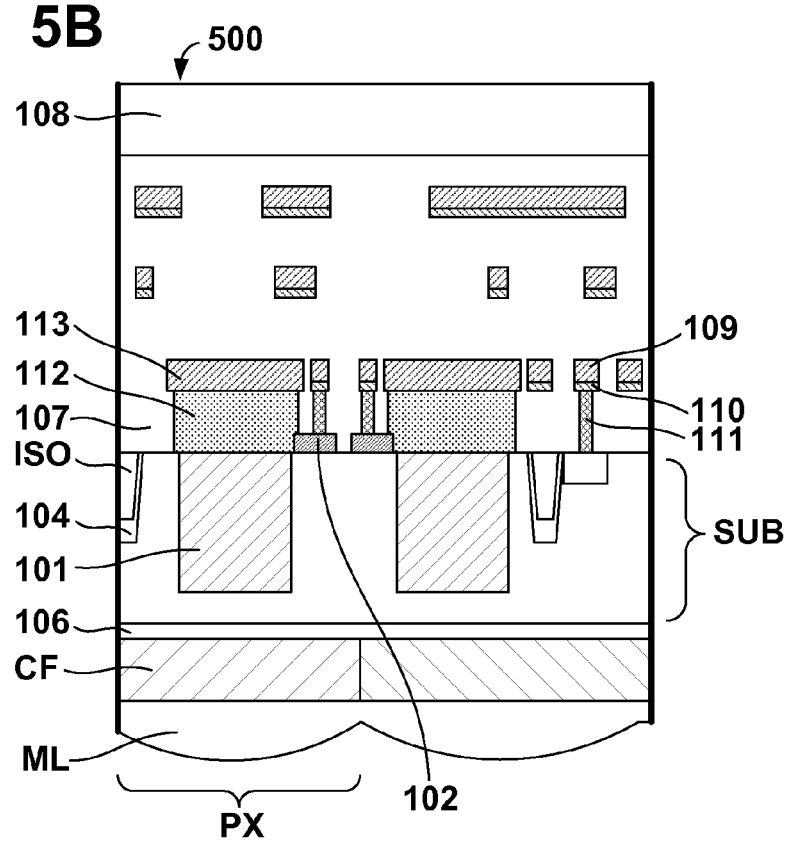

In an image sensing device 500 of FIGS. 5A and 5B, the relationship between the semiconductor region 101 and the high refractive index region 112 is different from that of the image sensing device 100. In the image sensing device 100 illustrated in FIGS. 1A and 1B, the area of the semiconductor region 101 on the front surface FS of the semiconductor substrate SUB is greater than the area of the bottom surface of the high refractive index region 112, and the high refractive index region 112 covers only part of the semiconductor region 101. Therefore, the interlayer insulating layer 107 (second non-metal region) covers part of the semiconductor region 101. According to the configuration, the light reflected by the reflection layer 113 can be efficiently collected on the semiconductor region 101. On the other hand, in the image sensing device 500 illustrated in FIGS. 5A and 5B, the area of the semiconductor region 101 on the front surface FS of the semiconductor substrate SUB is smaller than the area of the bottom surface of the high refractive index region 112, and the high refractive index region 112 covers the entire surface and surrounding parts of the semiconductor region 101. According to the configuration, the light penetrated through the semiconductor region 101 can be efficiently collected on the high refractive index region 112.

Figure 6A:
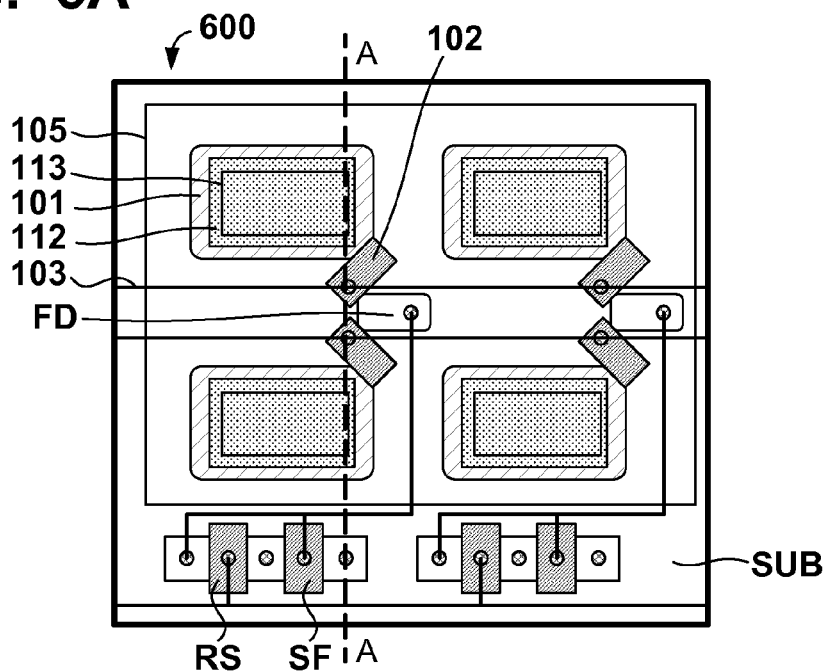
FIGS. 6A and 6B are diagrams for describing another modified example of the image sensing device.
Figure 6B:
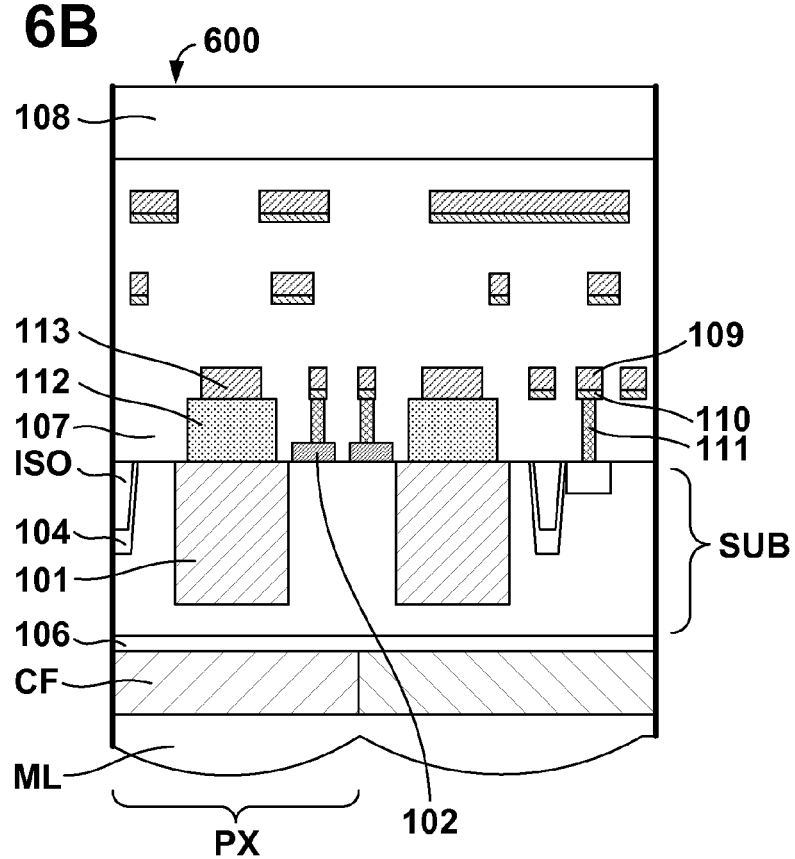

In an image sensing device 600 of FIGS. 6A and 6B, the relationship between the high refractive index region 112 and the reflection layer 113 is different from that of the image sensing device 100. In the image sensing device 100 illustrated in FIGS. 1A and 1B, the area of the upper surface of the high refractive index region 112 is smaller than the area of the bottom surface of the reflection layer 113, and the bottom surface of the reflection layer 113 covers the entire upper surface and surrounding parts of the semiconductor region 101. On the other hand, in the image sensing device 600 illustrated in FIGS. 6A and 6B, the area of the upper surface of the high refractive index region 112 is greater than the area of the bottom surface of the reflection layer 113, and the bottom surface of the reflection layer 113 covers only part of the upper surface of the semiconductor region 101.

In image sensing devices 700 and 710 of FIGS. 7A and 7B, the shape of the high refractive index region 112 is different from that of the image sensing device 100 of FIGS. 1A and 1B. In the image sensing device 100 illustrated in FIGS. 1A and 1B, the side of the high refractive index region 112 is orthogonal to the front surface FS of the semiconductor substrate SUB. More specifically, the side of the high refractive index region 112 is not inclined relative to the normal line of the semiconductor substrate SUB (normal line of the second surface). On the other hand, in the image sensing devices 700 and 710, the side of the high refractive index region 112 is inclined relative to the normal line of the front surface FS of the semiconductor substrate SUB. Specifically, in the image sensing device 700, the high refractive index region 112 is provided with a taper that becomes thinner with an increase in the distance from the semiconductor substrate SUB. In the image sensing device 710, the high refractive index region 112 is provided with a reverse taper that becomes thicker with an increase in the distance from the semiconductor substrate SUB. In this way, the high refractive index region 112 can be provided with the taper or the reverse taper to efficiently collect the light on the high refractive index region 112 even if the shape of the semiconductor region 101 or the reflection layer 113 is restricted.

In image sensing devices 800 and 810 of FIGS. 8A and 8B, the position of the reflection layer 113 is different from that of the image sensing device 100 of FIGS. 1A and 1B. In the image sensing device 100 illustrated in FIGS. 1A and 1B, the reflection layer 113 is formed at the same height (distance from the semiconductor substrate SUB) as the lowest wiring layer. On the other hand, in the image sensing devices 800 and 810 illustrated in FIGS. 8A and 8B, the reflection layer 113 is formed at a different height from any wiring layer. Specifically, the reflection layer 113 is formed lower than the lowest wiring layer in the image sensing device 800. The reflection layer 113 is formed higher than the highest wiring layer in the image sensing device 810. Although the high refractive index region 112 extends to the reflection layer 113 in the image sensing devices 800 and 810, the interlayer insulating layer 107 and other members may exist between the high refractive index region 112 and the reflection layer 113.

Image sensing devices 900 and 910 of FIGS. 9A and 9B are different from the image sensing device 100 of FIGS. 1A and 1B in that the reflection layer 113 is not included. The image sensing device 100 illustrated in FIGS. 1A and 1B includes the reflection layer 113. Therefore, the light penetrated through the photoelectric conversion portion can be returned to the photoelectric conversion portion, and the sensitivity of the photoelectric conversion portion improves. On the other hand, the image sensing devices 900 and 910 illustrated in FIGS. 9A and 9B do not include a reflection layer on the lowest wiring layer. This increases the degree of freedom of the wiring pattern 109 formed on the wiring layer of the first layer. In this modified example, the high refractive index region 112 may be formed up to the lowest wiring layer as in the image sensing device 900 or may be formed up to the highest wiring layer as in the image sensing device 910. The high refractive index region 112 may be formed up to a different height from the wiring layers. Even without the reflection layer 113, the high refractive index region 112 functions as a light guide to reduce the mixture of colors between adjacent pixels.

Image sensing devices 1000 and 1010 of FIGS. 10A and 10B are different from the image sensing device 100 of FIGS. 1A and 1B in that a non-metal low refractive region 1001 (second non-metal region) different from the interlayer insulating layer 107 is included at a position covering the side of the high refractive index region 112. The low refractive region 1001 may be formed by any non-metal material with a lower refractive index than the high refractive index region 112. For example, the low refractive region 1001 may be formed by silicon oxide, silicon nitride, boron phosphorus silicate glass, or the like. The low refractive region 1001 may be formed as an air gap. The formation of the low refractive region 1001 as an air gap can increase the difference between the refractive index of the high refractive index region 112 and the refractive index of the low refractive region 1001. The air gap can be formed by etching and removing a part around the high refractive index region 112 of the interlayer insulating layer 107 to form an opening in the process of FIG. 3A. Gas is sealed in the opening to form the air gap. The opening may be in a vacuum state.

In the image sensing device 1000, the high refractive index region 112 is formed by a different material from the interlayer insulating layer 107, as in the image sensing device 100. In the image sensing device 1010, the high refractive index region 112 is formed by the same material as the interlayer insulating layer 107. In other words, the high refractive index region 112 is formed as part of the interlayer insulating layer 107. In this case, the process for forming the high refractive index region 112 described with reference to FIGS. 2E and 3A can be omitted.

Image sensing devices 1100 and 1110 of FIGS. 11A and 11B are different from the image sensing device 100 of FIGS. 1A and 1B in that only specific pixels include the high refractive index region 112 and the reflection layer 113. The plurality of pixels PX of the image sensing devices 1100 and 1110 include pixels for detecting blue components (hereinafter "blue pixels"), pixels for detecting green components (hereinafter, "green pixels"), and pixels for detecting red components (hereinafter, "red pixels"). For example, the blue components denote components of about 430 to 480 nm wavelength. The green components denote components of about 500 to 570 nm wavelength. The red components denote components of about 610 to 780 nm wavelength. These pixels can be arranged according to a Bayer array, for example. The absorptivity of the semiconductor substrate SUB is high for light with a short wavelength such as blue light, and the amount of blue light penetrating through the semiconductor substrate SUB is small. Therefore, in the image sensing device 1100, the high refractive index region 112 and the reflection layer 113 are arranged only on the red pixels and the green pixels, and the high refractive index region 112 and the reflection layer 113 are not arranged for the blue pixels. The amount of green light penetrating through the semiconductor substrate SUB is also small depending on the thickness of the semiconductor substrate SUB. Therefore, in the image sensing device 1100, the high refractive index region 112 and the reflection layer 113 are arranged only on the red pixels, and the high refractive index region 112 and the reflection layer 113 are not arranged on the blue pixels and the green pixels. More generally, the degree of freedom of the wiring pattern in the wiring layer is increased by not arranging the high refractive index region 112 and the reflection layer 113 on photoelectric conversion portions for detecting light of a second wavelength band shorter than a first wavelength band.

Figure 12:
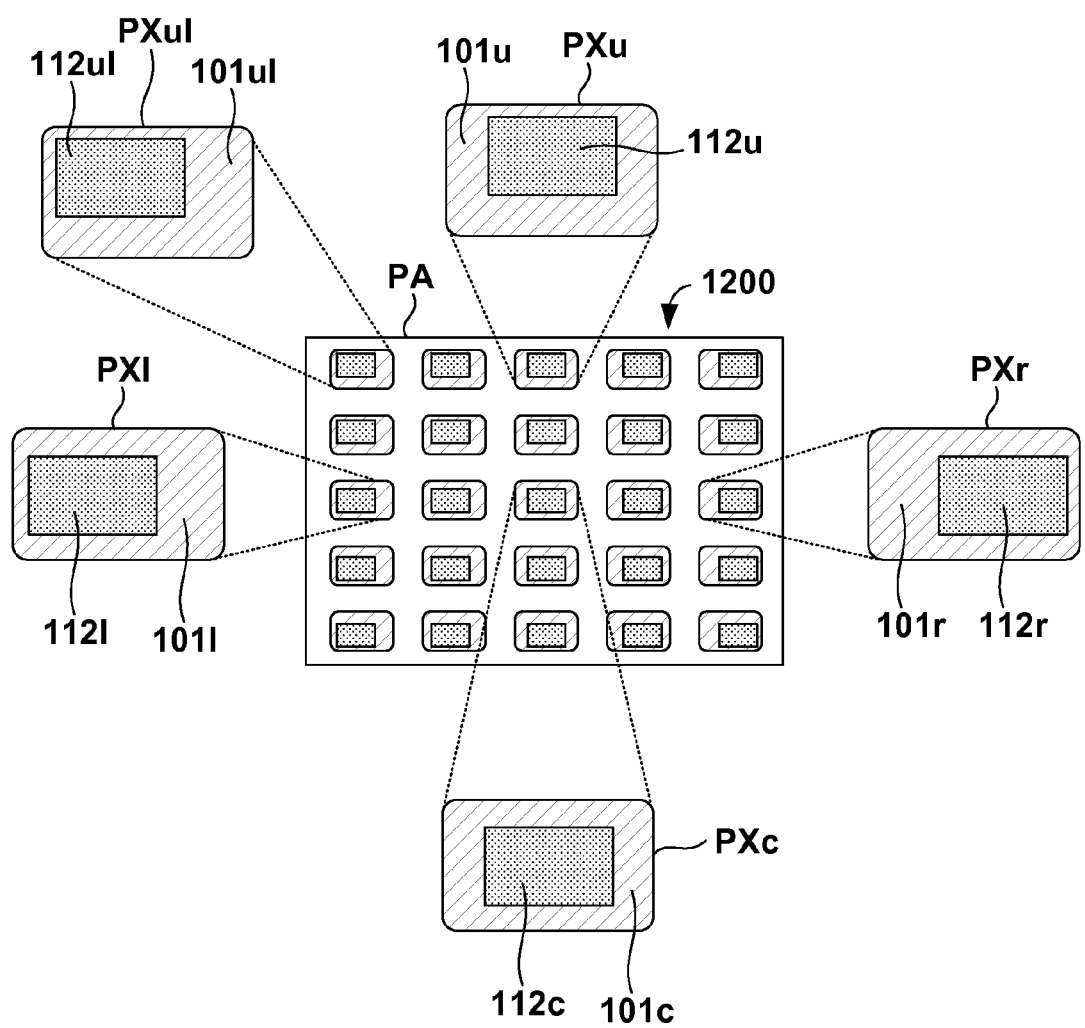
FIG. 12 is a diagram for describing another modified example of the image sensing device.

An image sensing device 1200 of FIG. 12 is different from the image sensing device 100 of FIGS. 1A and 1B in that the position of the high refractive index region 112 is different in each pixel. FIG. 12 illustrates a pixel array PA included in the image sensing device 1200. The pixel array PA includes a plurality of pixels, and for example, pixels of five rows and five columns are arranged. FIG. 12 illustrates only the semiconductor regions 101 that function as photoelectric conversion portions and the high refractive index regions 112. In the image sensing device 1200, the high refractive index region 112 is shifted from the center of the semiconductor region 101 (photoelectric conversion portion) of the pixel according to the position of the pixel in the pixel array PA. For example, in a pixel PXc positioned at the center of the pixel array PA, a high refractive index region 112c is positioned at the center of a semiconductor region 101c. In a pixel PXl positioned on the left side of the pixel array PA, a high refractive index region 112l is shifted to the left side of a semiconductor region 101l. In a pixel PXr positioned on the right side of the pixel array PA, a high refractive index region 112r is shifted to the right side of a semiconductor region 101r. In a pixel PXu positioned on the upper side of the pixel array PA, a high refractive index region 112u is shifted to the upper side of a semiconductor region 101u. In a pixel PXul positioned on the upper left side of the pixel array PA, a high refractive index region 112u1 is shifted to the upper left side of a semiconductor region 101u1. In this way, in the pixels PX included in the image sensing device 1200, the high refractive index regions 112 are shifted relative to the semiconductor regions 101, in directions viewed from the center of the pixel array PA. The amount of shifting may be greater in a pixel farther from the center of the pixel array PA. As a result of the arrangement, light obliquely entering a pixel arranged near the periphery of the pixel array PA can be efficiently collected on the high refractive index region 112.

A camera provided with the image sensing device will be illustratively described as an application of the image sensing device according to each of the embodiments described above. The concept of the camera includes not only a device primarily intended for image sensing, but also a device with an auxiliary image sensing function (for example, personal computer and mobile terminal). The camera includes: the image sensing device according to the present invention illustrated as the embodiments above; and a signal processing unit that processes a signal output from the image sensing device. The signal processing unit can include an A/D converter and a processor that processes digital data output from the A/D converter, for example.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-234067, filed Oct. 23, 2012, which is hereby incorporated by reference herein in its entirety.

What is claimed is:

1. An image sensing device comprising:
   a plurality of photoelectric conversion portions;
   a semiconductor substrate having a first surface for receiving incident light and a second surface on an opposite side to the first surface, the plurality of photoelectric conversion portions being provided therein;
   a first non-metal region arranged on a second surface side of the semiconductor substrate and arranged at a position at least partially overlapping with the plurality of photoelectric conversion portions;
   a second non-metal region arranged to face a side surface of the first non-metal region;
   a reflection layer arranged on an opposite side of the first non-metal region to the semiconductor substrate; and
   a wiring pattern on the second surface side of the semiconductor substrate, wherein the wiring pattern includes a portion that is arranged at different height than the reflection layer from the second surface of the semiconductor substrate,
   wherein a refractive index of the first non-metal region is higher than a refractive index of the second non-metal region, and
   wherein a bottom surface of the reflection layer faces an upper surface of the first non-metal region, and an area of the upper surface of the first non-metal region is smaller than an area of the bottom surface of the reflection layer.

2. The device according to claim 1, wherein the whole of the side surface of the first non-metal region is arranged between the reflection layer and the semiconductor substrate.

3. The device according to claim 1, further comprising a wiring pattern on the second surface side of the semiconductor substrate,
   wherein the reflection layer is patterned at the same time as a patterning process of the wiring pattern.

4. The device according to claim 1, wherein the second non-metal region contacts the side surface of the first non-metal region.

5. The device according to claim 1, further comprising a wiring pattern arranged on the second surface side of the semiconductor substrate,
   wherein the reflection layer is arranged closer to the semiconductor substrate than the wiring pattern is to the semiconductor substrate.

6. The device according to claim 1, wherein the first non-metal region covers boundaries between one of the plurality of photoelectric conversion portions and a region surrounding the one of the plurality of photoelectric conversion portions.

7. The device according to claim 1, wherein each of the plurality of photoelectric conversion portions includes a part covered by the second non-metal region.

8. The device according to claim 1, wherein the plurality of photoelectric conversion portions include:
   first photoelectric conversion portions for detecting light of a first wavelength band; and
   second photoelectric conversion portions for detecting light of a second wavelength band shorter than the first wavelength band, and
   the first non-metal region is arranged at a position at least partially overlapping with the first photoelectric conversion portions and not overlapping with the second photoelectric conversion portions.

9. The device according to claim 1, further comprising a wiring pattern on the second surface side of the semiconductor substrate,
   wherein the second non-metal region is an interlayer insulating layer arranged between the semiconductor substrate and the wiring pattern.

10. The device according to claim 1, wherein the first non-metal region arranged to be shifted from center of the photoelectric conversion portion according to positions of the plurality of photoelectric conversion portions.

11. A camera comprising:
    an image sensing device according to claim 1; and
    a signal processing device configured to process a signal from the image sensing device.

12. An image sensing device comprising:
    a plurality of photoelectric conversion portions;
    a semiconductor substrate having a first surface for receiving incident light and a second surface on an opposite side to the first surface, the plurality of photoelectric conversion portions being provided therein;
    a first non-metal region arranged on a second surface side of the semiconductor substrate and arranged at a position at least partially overlapping with the plurality of photoelectric conversion portions;
    a second non-metal region arranged to face a side surface of the first non-metal region; and
    a reflection layer arranged on an opposite side of the first non-metal region to the semiconductor substrate,
    wherein a refractive index of the first non-metal region is higher than a refractive index of the second non-metal region,
    wherein the side surface of the first non-metal region is inclined relative to a normal line of the second surface of the semiconductor substrate, and
    wherein the reflection layer covers the first non-metal region and the second non-metal region.

13. An image sensing device comprising:
    a plurality of photoelectric conversion portions;
    a semiconductor substrate having a first surface for receiving incident light and a second surface on an opposite side to the first surface, the plurality of photoelectric conversion portions being provided therein;

a first non-metal region arranged on a second surface side of the semiconductor substrate and arranged at a position at least partially overlapping with the plurality of photoelectric conversion portions;
a second non-metal region arranged to face a side surface of the first non-metal region; and
a reflection layer arranged on an opposite side of the first non-metal region to the semiconductor substrate,
wherein a refractive index of the first non-metal region is higher than a refractive index of the second non-metal region, and
wherein the second non-metal region is an air gap, and the air gap is covered with the reflection layer.

14. An image sensing device comprising:
a plurality of photoelectric conversion portions;
a semiconductor substrate having a first surface and a second surface on an opposite side to the first surface, the plurality of photoelectric conversion portions being provided therein;
a microlens arranged on a first surface side of the semiconductor substrate;
a first insulating layer arranged on a second surface side of the semiconductor substrate and arranged at a position at least partially overlapping with the plurality of photoelectric conversion portions;
a second insulating layer arranged to surround a side surface of the first insulating layer;
a metal layer arranged on an opposite side of the first insulating layer to the semiconductor substrate; and
a wiring pattern on the second surface side of the semiconductor substrate, wherein the wiring pattern includes a portion that is arranged at different height than the metal layer from the second surface of the semiconductor substrate,
wherein a material of the first insulating layer is different from a material of the second insulating layer, and a part of the second insulating layer is arranged between the metal layer and the semiconductor substrate.

15. A camera comprising:
an image sensing device according to claim 14; and
a signal processing device configured to process a signal from the image sensing device.

16. The device according to claim 14, wherein the second insulating layer contacts the side surface of the first insulating layer.

17. The device according to claim 14, further comprising a wiring pattern arranged on the second surface side of the semiconductor substrate,
wherein the metal layer is arranged closer to the semiconductor substrate than the wiring pattern is.

18. The device according to claim 14, wherein the side surface of the first insulating layer is arranged between the metal layer and the semiconductor substrate.

19. The device according to claim 14, wherein the material of the first insulating layer is silicon nitride, silicon oxynitride, or titanium oxide, and the material of the second insulating layer is silicon oxide or silicate glass.

* * * * *